(12) United States Patent
Chang et al.

(10) Patent No.: US 10,331,277 B2
(45) Date of Patent: Jun. 25, 2019

(54) TOUCH PROJECTION SCREEN AND TOUCH PROJECTION SYSTEM

(71) Applicant: Coretronic Corporation, Hsin-Chu (TW)

(72) Inventors: Kun-Rong Chang, Hsin-Chu (TW); Nan-Jiun Yin, Hsin-Chu (TW); Pen-Ning Kuo, Hsin-Chu, TN (US)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 14/864,914

(22) Filed: Sep. 25, 2015

(65) Prior Publication Data

US 2016/0266705 A1    Sep. 15, 2016

(30) Foreign Application Priority Data

Mar. 13, 2015    (TW) .............................. 104108125 A

(51) Int. Cl.
| | |
|---|---|
| *G06F 3/00* | (2006.01) |
| *G06F 3/044* | (2006.01) |
| *H03K 17/96* | (2006.01) |

(52) U.S. Cl.
CPC .............. *G06F 3/044* (2013.01); *G06F 3/005* (2013.01); *H03K 17/9618* (2013.01)

(58) Field of Classification Search
CPC ... H03K 17/9618; G06F 3/044; G06F 1/1639; G06F 3/041; G06F 3/005; G02F 1/13452; H04M 1/0202; H01L 27/1266

(Continued)

(56) References Cited

U.S. PATENT DOCUMENTS

2005/0243239 A1*  11/2005  Kondo ................ G02F 1/13452
                                                                   349/58
2007/0139397 A1    6/2007  Cross
                      (Continued)

FOREIGN PATENT DOCUMENTS

| CN | 1361471 | 7/2002 |
|---|---|---|
| CN | 202171790 | 3/2012 |

(Continued)

OTHER PUBLICATIONS

"Notice of Allowance of Taiwan Counterpart Application," dated Aug. 9, 2016, p. 1-p. 3, in which the listed references were cited.

(Continued)

*Primary Examiner* — Abdul-Samad A Adediran
(74) *Attorney, Agent, or Firm* — JCIPRNET

(57) ABSTRACT

A touch projection screen includes a substrate, a first touch layer, a second touch layer, a reflective projection film and a circuit board. The substrate has a first surface and a second surface. The first touch layer is disposed on the first surface and extends around an edge of the substrate to cover a part of the second surface of the substrate. The second touch layer is disposed on the first touch layer and extends around an edge of the substrate to cover a part of the second surface of the substrate. The reflective projection film is disposed on the second touch layer. The circuit board is disposed on the second surface of the substrate and electrically connects the first and second touch layers. A touch projection system includes the touch projection screen and a projection device. The projection device projects an image beam onto the touch projection screen.

13 Claims, 6 Drawing Sheets

(58) Field of Classification Search
USPC ...... 200/5 R, 600; 257/40; 349/58; 430/319; 704/260; 345/174; 73/862.381
See application file for complete search history.

(56) References Cited

U.S. PATENT DOCUMENTS

| | | | |
|---|---|---|---|
| 2008/0223708 A1* | 9/2008 | Joo | H04M 1/0202 200/600 |
| 2010/0028811 A1* | 2/2010 | Geaghan | G06F 3/044 430/319 |
| 2011/0084935 A1* | 4/2011 | Cheng | G06F 3/041 345/174 |
| 2011/0304571 A1 | 12/2011 | Kim et al. | |
| 2012/0035934 A1* | 2/2012 | Cunningham | G06F 1/1639 704/260 |
| 2012/0169401 A1 | 7/2012 | Hristov et al. | |
| 2013/0038548 A1 | 2/2013 | Kitada et al. | |
| 2013/0279152 A1 | 10/2013 | Lee | |
| 2013/0319137 A1* | 12/2013 | Grau | G06F 3/005 73/862.381 |
| 2014/0009443 A1 | 1/2014 | Hung | |
| 2014/0092041 A1 | 4/2014 | Ih | |
| 2014/0347295 A1 | 11/2014 | Kim et al. | |
| 2015/0122623 A1* | 5/2015 | Kim | H03K 17/9618 200/5 R |
| 2015/0155505 A1* | 6/2015 | Yamazaki | H01L 27/1266 257/40 |
| 2015/0185887 A1 | 7/2015 | Park et al. | |
| 2016/0216789 A1 | 7/2016 | Chang et al. | |

FOREIGN PATENT DOCUMENTS

| | | |
|---|---|---|
| CN | 102646001 | 8/2012 |
| CN | 102967959 | 3/2013 |
| CN | 103376934 | 10/2013 |
| CN | 103383617 | 11/2013 |
| CN | 103384866 | 11/2013 |
| CN | 103440070 | 12/2013 |
| CN | 103577018 | 2/2014 |
| CN | 103729083 | 4/2014 |
| CN | 103970333 | 8/2014 |
| CN | 103984457 | 8/2014 |
| CN | 104007885 | 8/2014 |
| JP | 2003005617 | 1/2003 |
| JP | 2012073360 | 4/2012 |
| JP | 5573551 | 8/2014 |
| TW | M339050 | 8/2008 |
| TW | I407338 | 9/2013 |
| TW | I423096 | 1/2014 |
| TW | M470320 | 1/2014 |

OTHER PUBLICATIONS

"Office Action of China Counterpart Application," dated Aug. 1, 2017, p. 1-p. 7, in which the listed references were cited.
"Office Action of China Counterpart Application," dated Apr. 11, 2018, p. 1-p. 7, in which the listed references were cited.

* cited by examiner

TOUCH PROJECTION SCREEN AND TOUCH PROJECTION SYSTEM

CROSS-REFERENCE TO RELATED APPLICATION

This application claims the priority benefit of Taiwan application serial no. 104108125, filed on Mar. 13, 2015. The entirety of the above-mentioned patent application is hereby incorporated by reference herein and made a part of this specification.

BACKGROUND

Field of the Disclosure

The invention relates to a projection screen, and relates particularly to a touch projection screen and a touch projection system including a projection device and the touch projection screen.

Description of Related Art

Along with electronic devices developing in a direction for having multiple functionality, conventional touch-tone operation interfaces have gradually become unable to meet the needs of a user. Under these circumstances, interactive touch technology has been developing vigorously. Compared to conventional touch-tone operation interfaces, the input methods of the interactive touch operation interfaces are becoming simple and intuitive. The user may perform touch input on a display of the electronic device directly using a finger or stylus. The interactive touch technology is being implemented in a projection screen, for projecting images, of a projecting device so a user is able to perform touch input on the projection screen.

Touch projection screens adopting capacitive touch technology have an electrode circuit and a gathering circuit connected to the electrode circuit. The electrode circuit and the gathering circuit are typically disposed on the front surface of the touch projection screen, wherein the gathering circuit typically is disposed at an edge of the projection screen. However, because the gathering circuit do not have touch functionality, the area of the gathering circuit become non-active touch areas, and non-active touch areas still occupy a certain area. Therefore, a frame is added to conceal the gathering circuit, accordingly increasing the volume occupied by the touch projection screen.

The information disclosed in the "BACKGROUND OF THE INVENTION" section is only for enhancement of understanding of the background of the described technology, and therefore it may contain information that does not form the prior art that is already known to a person of ordinary skill in the art. Further, the information disclosed in the "BACKGROUND OF THE INVENTION" section does not mean that one or more problems to be resolved by one or more embodiments of the invention was acknowledged by a person of ordinary skill in the art.

SUMMARY OF THE DISCLOSURE

The invention provides a touch projection screen, significantly lowering a non-active touch area, so as to increase active touch area for using and achieve narrow frame of the touch projection screen.

The invention provides a touch projection system, which touch projection screen thereof significantly lowers a non-active touch area.

Other objectives and advantages of the invention may be further understood from the technical features broadly embodied and disclosed as follows.

To achieve one, a part, all of the above objectives or other objectives, an embodiment of the invention provides a touch projection screen. The touch projection screen includes a substrate, a first touch layer, a second touch layer, a reflective projection film and a circuit board. The substrate has a first surface and a second surface opposite to the first surface. The first touch layer is disposed on the first surface of the substrate and extending around an edge of the substrate to cover a part of the second surface of the substrate. The second touch layer is disposed on the first touch layer and extending around an edge of the substrate to cover a part of the second surface of the substrate. The reflective projection film is disposed on the second touch layer. The circuit board, disposed on the second surface of the substrate and electrically connected with the first touch layer and the second touch layer.

In an embodiment of the invention, the first touch layer has a first electrode circuit and a first gathering circuit electrically connected to the first electrode circuit, at least a part of the first electrode circuit is located at the first surface of the substrate, and the first gathering circuit is located at the second surface of the substrate and electrically connected with the circuit board.

In an embodiment of the invention, the second touch layer has a second electrode circuit and a second gathering circuit electrically connected to the second electrode circuit, at least a part of the second electrode circuit is located at the first surface of the substrate, and the second gathering circuit is located at the second surface of the substrate and electrically connected to the circuit board.

In an embodiment of the invention, the reflective projection film further extends around an edge of the substrate from the first surface of the substrate to cover a part of the second surface of the substrate.

In an embodiment of the invention, the touch projection screen further includes a pad disposed on the second surface of the substrate.

In an embodiment of the invention, a part of the first touch layer covering the second surface of the substrate is disposed on the pad.

In an embodiment of the invention, a part of the second touch layer covering the second surface of the substrate is disposed on the pad.

In an embodiment of the invention, the pad has an opening, and the circuit board is disposed at the opening.

In an embodiment of the invention, a depth of the opening is greater than or equal to a thickness of the circuit board.

In an embodiment of the invention, the substrate is a rigid board, and the pad is a flexible and soft pad.

In an embodiment of the invention, the first touch layer is formed by a plurality of first sub-touch layers aligned adjacent to each other.

In an embodiment of the invention, the second touch layer is formed by a plurality of second sub-touch layers aligned adjacent to each other.

In an embodiment of the invention, the substrate is formed by a plurality of sub-substrates aligned adjacent to each other.

In order to achieve one, a part, all of the above objectives or other objectives, an embodiment of the invention provides a touch projection system. The touch projection system includes a touch projection screen and a projection device, wherein the projection device projects an image beam onto the touch projection screen.

Based on the above, the embodiments of the invention have at least one of the features below. In the above embodiments of the invention, a non-active area of the touch projection screen may be transferred to the second surface of the substrate by the first touch layer and the second touch layer extending to the second surface of the substrate. Therefore, the non-active touch area located on the first surface of the substrate of the touch projection screen is lowered, and the active touch area located on the first surface of the substrate of the touch projection screen is expanded.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
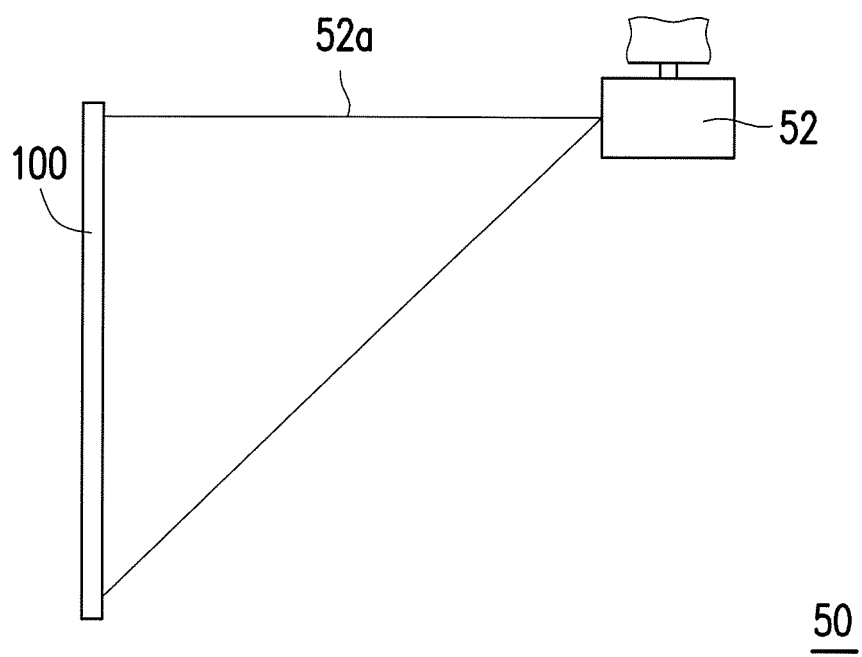
FIG. 1 is a schematic diagram of a touch projection system according to an embodiment of the invention.

FIG. 1 is a schematic diagram of a touch projection system according to an embodiment of the invention. Referring to FIG. 1, the touch projection system 50 of the present embodiment includes a touch projection screen 100 and a projection device 52. The touch projection screen 100, for example, is a capacitive touch projection screen. The projection device 52 is used to project an image beam 52a onto the touch projection screen 100 to provide viewing for a user, and the user may perform touch operations on the touch projection screen 100, so as to change the viewing content projected from the projection device 52.

Figure 2:
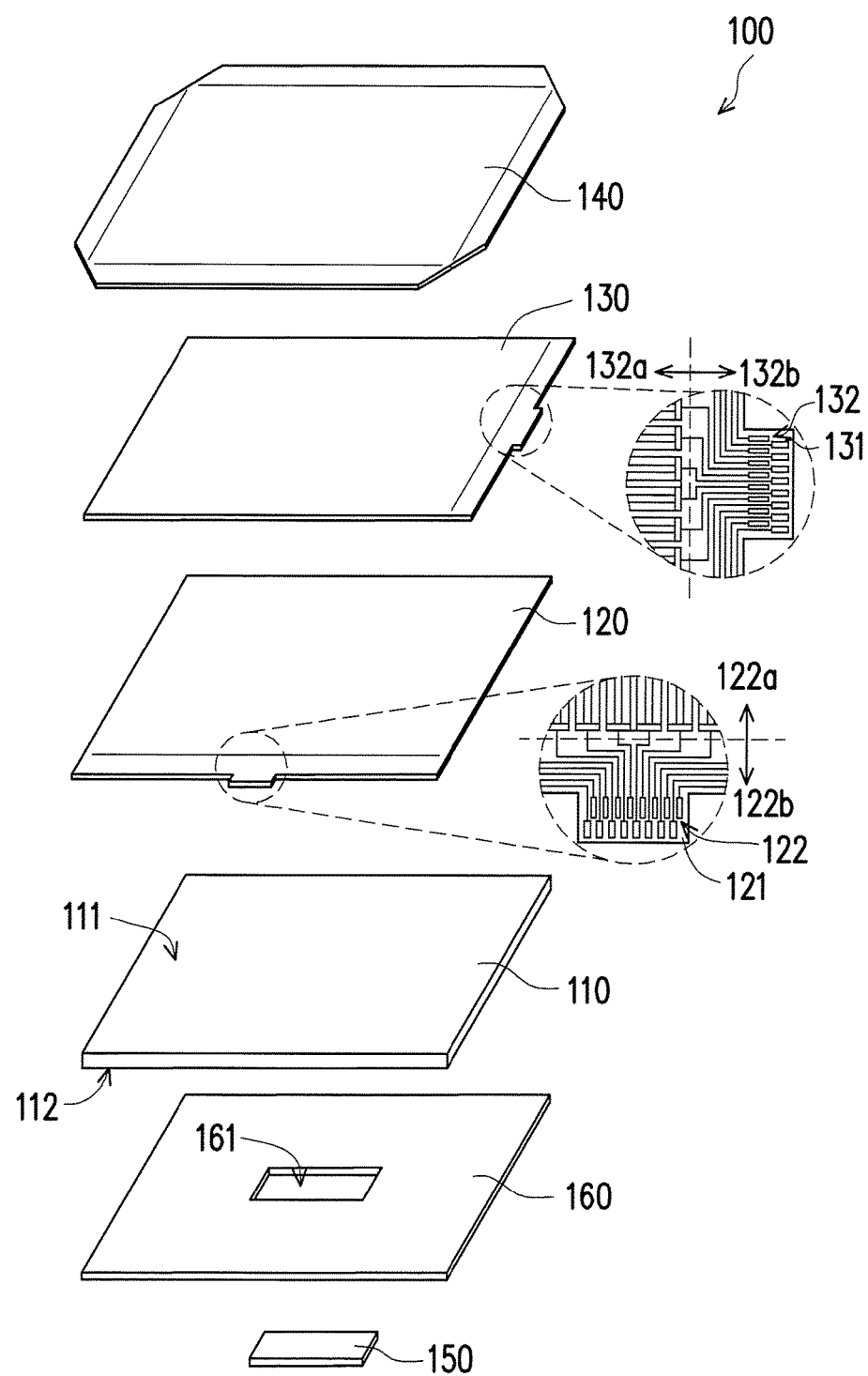
FIG. 2 is an exploded view of a touch projection screen according to an embodiment of the invention.
Figure 3:
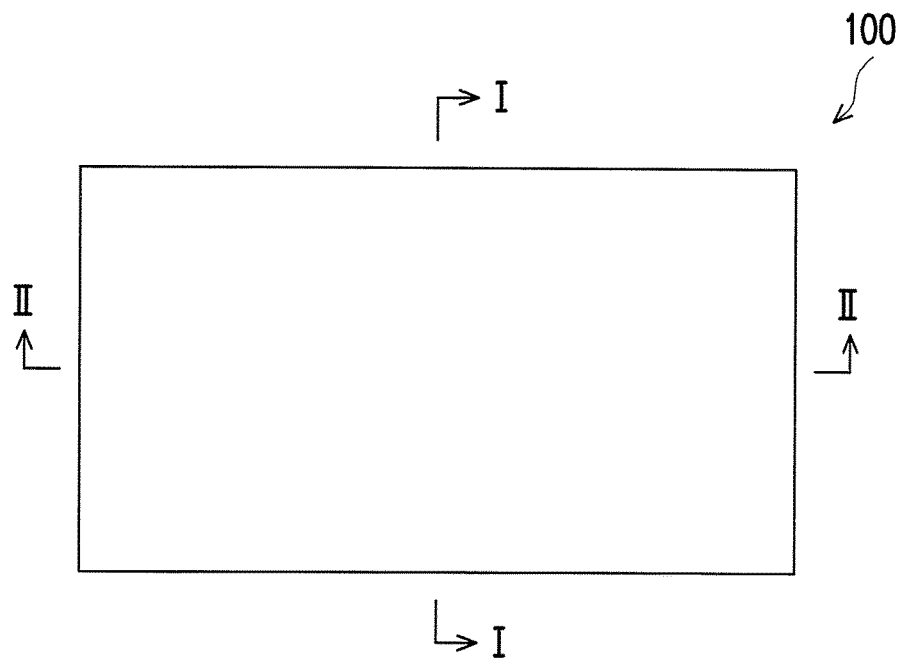
FIG. 3 is a front view of the touch projection screen of FIG. 1.
Figure 4:
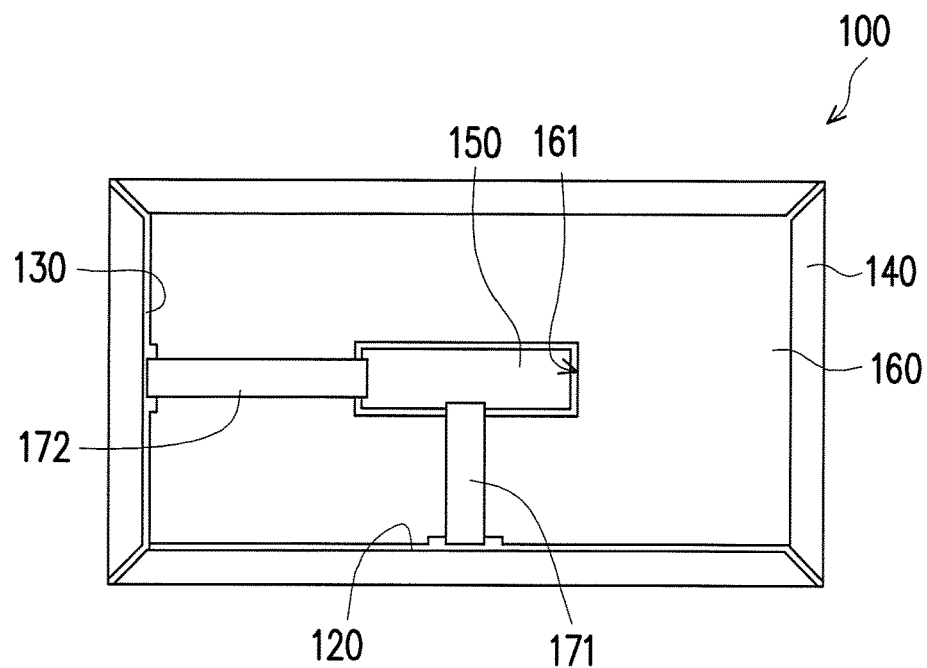
FIG. 4 is a rear view of the touch projection screen of FIG. 1.

FIG. 2 is an exploded view of a touch projection screen according to an embodiment of the invention. FIG. 3 is a front view of the touch projection screen of FIG. 1. FIG. 4 is a rear view of the touch projection screen of FIG. 1. Referring to FIG. 2, FIG. 3 and FIG. 4, in the present embodiment, the touch projection screen 100 includes a substrate 110, a first touch layer 120, a second touch layer 130, a reflective projection film 140 and a circuit board 150. The substrate 110 has a first surface 111 and a second surface 112 opposite to the first surface 111. In the present embodiment, the substrate 110 may be a rigid board, used to provide the touch projection screen 100 with adequate structural support, but the invention is not limited thereto. In the another embodiment, the substrate 110 may also be a board material having flexibility which may be rolled to lessen the space occupied when the touch projection screen 100 is not in use. The first touch layer 120 and the second touch layer 130 may be a signal transmitting end and a signal receiving end respectively, to receive touch input signals from the user.

Figure 5:
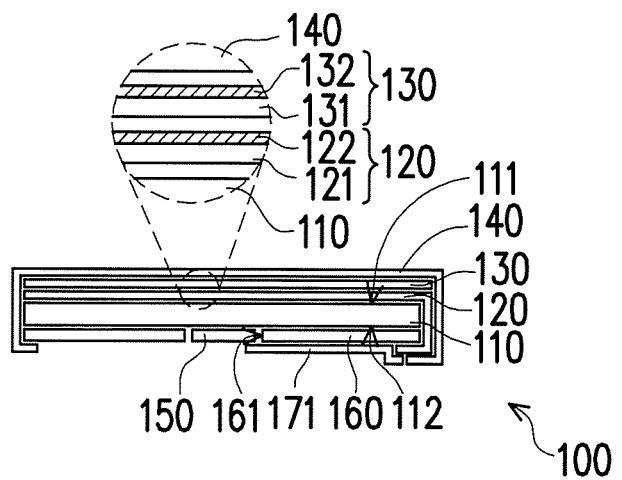
FIG. 5 is a cross-sectional view of the touch projection screen of FIG. 3 taken along line I-I.

FIG. 5 is a cross-sectional view of the touch projection screen of FIG. 3 taken along line I-I. Referring to FIG. 2 and FIG. 5, the first touch layer 120 is disposed on the first surface 111 of the substrate 110 and extends around an edge of the substrate 110 to cover a part of the second surface 112 of the substrate 110. In the present embodiment, the first touch layer 120 may be stuck to the first surface 111 and the second surface 112 of the substrate 110 by an adhesive. The first touch layer 120 has a first electrode circuit 122a and a gathering circuit 122b electrically connected to the first electrode circuit 122a. At least a part of the first electrode circuit 122a is located at the first surface 111 of the substrate 110. The first gathering circuit 122b is located at the second surface 112 of the substrate 110 and electrically connected with the circuit board 150. More specifically, the first touch layer 120 has a first base layer 121 and a first circuit layer 122 disposed at the first base layer 121, and the first circuit layer 122 composes the above mentioned first electrode circuit 122a and the first gathering circuit 122b. In the present embodiment, the first base layer 121, for example, is polyethylene terephthalate (PET) film or other non-conductive film material having flexibility, and the first circuit layer 122, for example, is a conductive silver paste pattern or other suitable metal material printed on the PET film, but the invention is not limited thereto.

Figure 6:
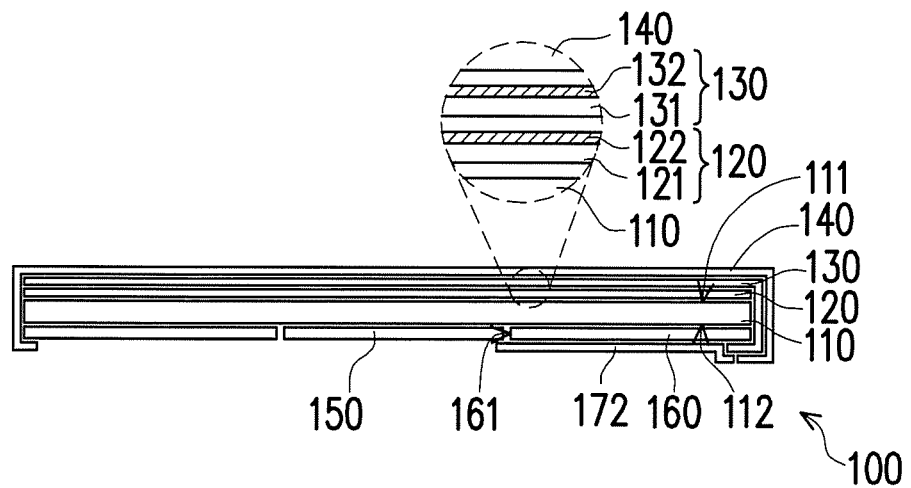
FIG. 6 is a cross-sectional view of the touch projection screen of FIG. 3 taken along line II-II.

FIG. 6 is a cross-sectional view of the touch projection screen of FIG. 3 taken along line II-II. Referring to FIG. 2 and FIG. 6, the second touch layer 130 is disposed on the first touch layer 120 and extends around an edge of the substrate 110 to cover a part of the second surface 112 of the substrate 110. In the present embodiment, the second touch layer 130 may be stuck to the first touch layer 120 and the second surface 112 of the substrate 110 by an adhesive. The second touch layer 130 has a second electrode circuit 132a and a second gathering circuit 132b electrically connected to the second electrode circuit 132a. At least a part of the second electrode circuit 132a is located at the first surface 111 of the substrate 110, and the second gathering circuit 132b is located at the second surface 112 of the substrate 110 and electrically connected with the circuit board 150. More specifically, the second touch layer 130 has a second base layer 131 and a second circuit layer 132 disposed at the second base layer 131, and the second circuit layer 132 composes the above mentioned second electrode circuit 132a and the second gathering circuit 132b. In the present embodiment, the second base layer 131, for example, is PET film or other non-conductive film material having flexibility, and the second circuit layer 132, for example, is a conductive silver paste pattern or other suitable metal material printed on the PET film, but it should not be construed as a limitation to the invention.

Referring to FIG. 2, FIG. 5 and FIG. 6, the reflective projection film 140 is disposed on the second touch layer 130. In the present embodiment, the reflective projection film 140 may be stuck to the second touch layer 130 by an adhesive. In the present embodiment, the reflective projection film 140 may extend around an edge of the substrate from the first surface 111 of the substrate 110 to cover a part of the second surface 112 of the substrate, but it should not be construed as a limitation to the invention. In other embodiments, the reflective projection film 140 may not cover the second surface 112 of the substrate 110. The reflective projection film 140, for example, is a white plastic film with reflective function or other non-transparent suitable material, but the invention is not limited thereto.

Referring to FIG. 2, FIG. 4, FIG. 5 and FIG. 6, the circuit board 150 is disposed on the second surface 112 of the substrate and electrically connected with the first touch layer 120 and the second touch layer 130. In the present embodiment, the first gathering circuit 122b of the first touch layer 120 is electrically connected to the circuit board 150 through a first circuit gathering board 171, and the second gathering circuit 132b of the second touch layer 130 is electrically connected to the circuit board 150 through a second circuit gathering board 172, wherein the first circuit gathering board 171 and the second circuit gathering board 172, for example, are flexible circuit boards, but the invention is not limited thereto. The first touch layer 120 and the second touch layer 130 may also extend and electrically connect directly to the circuit board 150 (namely, the first circuit gathering board 171 and the first touch layer 120 are integrally formed, and the second circuit gathering board 172 and the second touch layer 130 are integrally formed).

In the present embodiment, the touch projection screen 100 further includes a pad 160. When the substrate 110 is a rigid board, the pad 160 may be a flexible and soft pad. When it is desired to attach the touch projection screen 100 to a flat surface such as a wall, the pad 160 may provide cushioning to protect the internal components of the touch projection screen 100. The pad 160 is disposed on the second surface 112 of the substrate 110, and a part of the first touch layer 120 covering the second surface 112 of the substrate 110 is disposed on the pad 160, and a part of the second touch layer 130 covering the second surface 112 of the substrate 110 is disposed on the pad 160. The pad 160 further has an opening 161, and the circuit board 150 is disposed at the opening 161 such that the first touch layer 120 and the second touch layer 130 are electrically connected to the circuit board 150. In addition, a depth of the opening 161 is greater than or equal to a thickness of the circuit board 150 for the circuit board 150 to be embedded into the opening 161 and not protrude from the pad 160.

Figure 7:
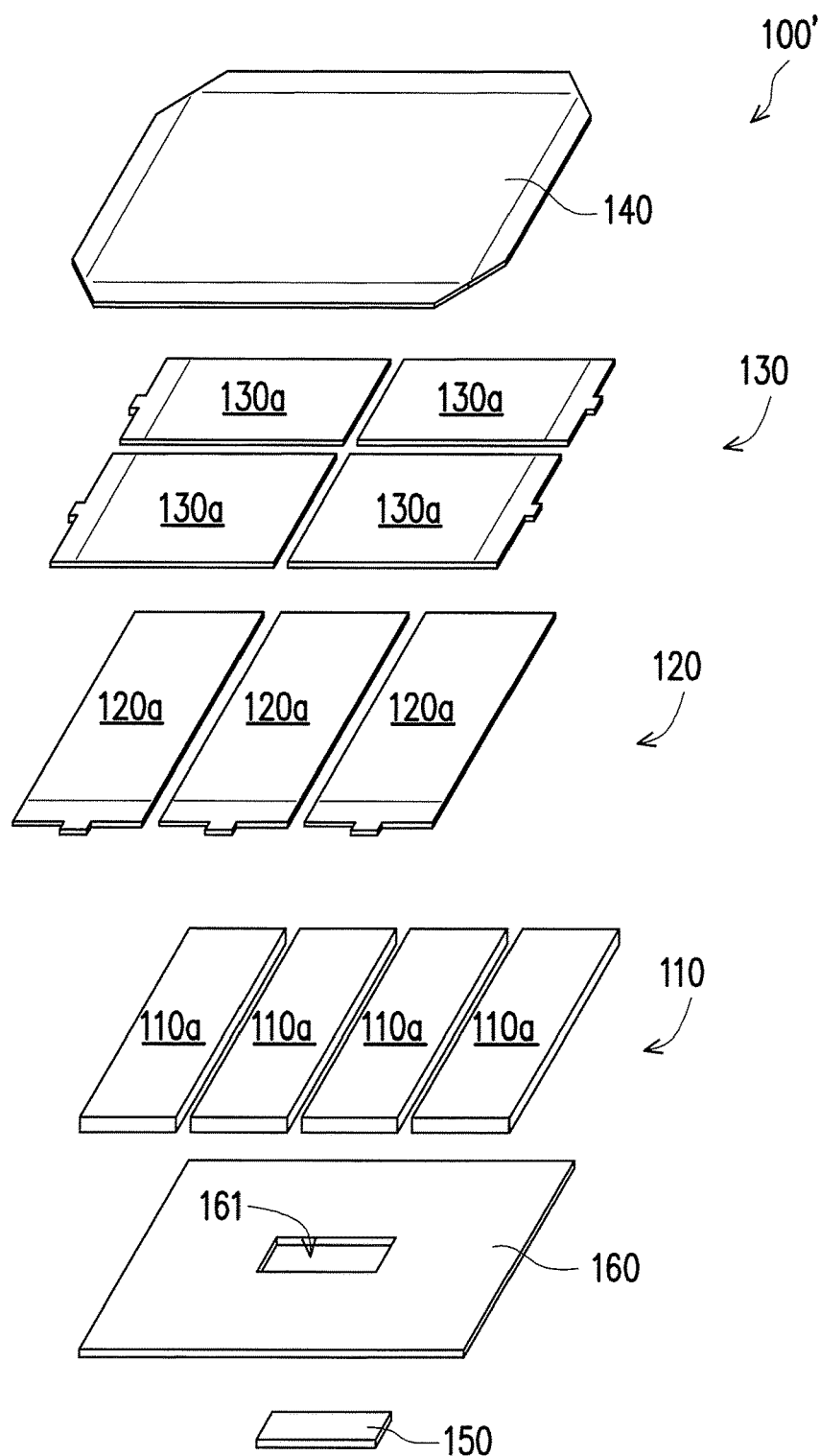
FIG. 7 is an exploded view of a touch projection screen according to another embodiment of the invention.

FIG. 7 is an exploded view of a touch projection screen according to another embodiment of the invention. Referring to FIG. 7, a touch projection screen 100' of FIG. 7 and the touch projection screen 100 of FIG. 2 are similar. The difference between the two lies in: The first touch layer 120 of the touch projection screen 100' is formed by a plurality of first sub-touch layers 120a (three first sub-touch layers 120a are schematically shown in FIG. 7, but the number of first sub-touch layers should not be construed as a limitation to the invention) aligned adjacent to each other, and the second touch layer 130 is formed by a plurality of second sub-touch layers 130a (four second sub-touch layers 130a are schematically shown in FIG. 7, but the number of second sub-touch layers should not be construed as a limitation to the invention) aligned adjacent to each other. Each of the first sub-touch layers 120a and the first touch layer 120 of FIG. 2 are structurally similar and are electrically connected to the circuit board 150, each of the second sub-touch layers 130a and the second touch layer 130 of FIG. 2 are structurally similar and are electrically connected to the circuit board 150. Therefore, a large sized first touch layer 120 may be composed by the first sub-touch layers 120a, and a large sized second touch layer 130 may be composed by the second sub-touch layers 130a. In addition, the circuit layers (including the electrode circuit and the gathering circuit) are typically formed on the base layer by a method of printing, and due to the printing equipment typically having limitations in printing size. Therefore, in this embodiment of the invention, the first sub-touch layers 120a and the second sub-touch layers 130a may be used for forming a large sized touch projection screen 100'.

Referring to FIG. 7, in the present embodiment, the substrate 110 of the touch projection screen 100' may be formed by a plurality of sub-substrates 110a (for example, four sub-substrates 110a) aligned adjacent to each other. Therefore, when the substrate 110 is a rigid board, a plurality of sub-substrates 110a may be adopted to lower the volume occupied during storage or transportation, and also a large sized touch projection screen 100' may be manufactured from the sub-substrates 110a. In addition, in the touch projection screen 100 of FIG. 2, the substrate 110 also may be formed by a plurality of sub-substrates 110a aligned adjacent to each other, but the invention is not limited thereto.

Figure 8:
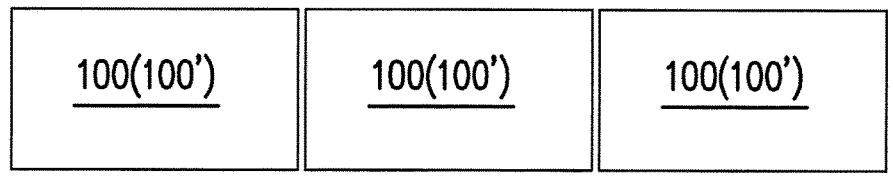
FIG. 8 is a front view of a plurality of touch projection screens aligned side by side according to an embodiment of the invention.

FIG. 8 is a front view of a plurality of touch projection screens 100 or 100' aligned side by side according to an embodiment of the invention. Due to an edge of the touch projection screen 100 of FIG. 2 and the touch projection screen 100' of FIG. 7 contacting an active area, a plurality of touch projection screens 100 or 100' may be aligned adjacent to each other to form an even larger sized touch projection screen. In addition, an electrical isolation material may be selectively disposed between adjacent touch projection screens 100 or 100', to lower the electrical interference of each touch projection screen 100 or 100' between each other.

In summary, the embodiments of the invention have at least one of the features below. In the above embodiments of the invention, a non-active area of the touch projection screen may be transferred to the second surface of the substrate by the first touch layer and the second touch layer extending to the second surface of the substrate. Therefore, lowering the non-active touch area located on the first surface of the substrate of the touch projection screen, and respectively expanding the active touch area located on the first surface of the substrate of the touch projection screen. More specifically, by transferring and disposing all or a portion of the gathering circuits (namely the non-active touch area) of the touch layers of the touch projection screen onto the second surface of the substrate, an area of the electrode circuit (namely the active touch area) of the touch layers of the touch projection screen on the first surface of the substrate may be increased, and the electrode circuit (namely the active touch area) of the touch layers may occupy all of the first surface of the substrate. Therefore, under dimensions of the same size, the area of the active touch area of the front surface of the touch projection screen may be increased, and the non-active touch area of the touch projection screen may be lessened or eliminated respectively.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch projection screen, comprising:
    a substrate, comprising a first surface and a second surface opposite to the first surface;
    a first touch layer, having a first active touch area and a first non-active touch area, disposed on the first surface of the substrate, and extending around a first edge of the substrate to cover a first part of the second surface of the substrate, wherein the first active touch area is disposed at the first surface of the substrate and the first non-active touch area having at least a first portion that is disposed only at a first edge portion of the second surface of the substrate and a second edge portion of the second surface of the substrate;
    a second touch layer, having a second active touch area and a second non-active touch area, disposed on the first touch layer, and extending around a second edge of the substrate to cover a second part of the second surface of the substrate, wherein the second active touch area is disposed at the first surface of the substrate and the second non-active touch area having at least a second portion that is disposed only at the second edge portion of the second surface of the substrate and a third edge portion of the second surface of the substrate;
    a reflective projection film, disposed on the second touch layer, wherein the reflective projection film is adapted to reflect an image beam from a projection device outside the touch projection screen, and the reflective projection film further extends around an edge of the substrate from the first surface of the substrate to cover a part of the second surface of the substrate; and
    a circuit board, disposed on the second surface of the substrate and electrically connected with the first touch layer and the second touch layer,
    wherein the first edge portion and the third edge portion are different, the first edge portion is perpendicular to the third edge portion, and the second edge portion is connected between the first edge portion and the third edge portion.

2. The touch projection screen of claim 1, wherein the first touch layer comprises a first electrode circuit and a first gathering circuit adapted to electrically connect to the first electrode circuit, at least a part of the first electrode circuit is located at the first surface of the substrate, and the first gathering circuit is located at the second surface of the substrate and adapted to electrically connect with the circuit board.

3. The touch projection screen of claim 2, further comprising:
    a first circuit gathering board, disposed on the second surface of the substrate; and
    a second gathering circuit of the second touch layer, disposed on the second surface of the substrate, wherein the first gathering circuit of the first touch layer is electrically connected to the circuit board through the first circuit gathering board, and the second gathering circuit of the second touch layer is electrically connected to the circuit board through a second circuit gathering board.

4. The touch projection screen of claim 3, wherein the second touch layer comprises a second electrode circuit and the second gathering circuit adapted to electrically connect to the second electrode circuit, at least a part of the second electrode circuit is located at the first surface of the substrate, and the second gathering circuit is located at the second surface of the substrate and adapted to electrically connect to the circuit board.

5. The touch projection screen of claim 1, further comprising:
a pad, disposed on the second surface of the substrate, wherein a part of the first touch layer covering the second surface of the substrate is disposed directly on the pad, and a part of the second touch layer covering the second surface of the substrate is directly disposed on the pad.

6. The touch projection screen of claim 1, further comprising:
a pad, disposed on the second surface of the substrate, wherein a part of the first touch layer covering the second surface of the substrate is disposed directly on the pad, and the pad comprises an opening, and the circuit board is disposed at the opening.

7. The touch projection screen of claim 6, wherein a depth of the opening is greater than or equal to a thickness of the circuit board.

8. The touch projection screen of claim 6, wherein the substrate is a rigid board, and the pad is a flexible and soft pad.

9. The touch projection screen of claim 1, wherein the first touch layer is formed by a plurality of first sub-touch layers aligned adjacent to each other.

10. The touch projection screen of claim 1, wherein the second touch layer is formed by a plurality of second sub-touch layers aligned adjacent to each other.

11. The touch projection screen of claim 1, wherein the substrate is formed by a plurality of sub-substrates aligned adjacent to each other.

12. The touch projection screen of claim 1, wherein the reflective projection film is non-transparent.

13. A touch projection system, comprising:
a projection device, adapted to project an image beam; and
a touch projection screen, comprising:
a substrate, comprising a first surface and a second surface opposite to the first surface;
a first touch layer, having a first active touch area and a first non-active touch area, disposed on the first surface of the substrate, and extending around a first edge of the substrate to cover a first part of the second surface of the substrate, wherein the first active touch area is disposed at the first surface of the substrate and the first non-active touch area having at least a first portion that is disposed only at a first edge portion of the second surface of the substrate and a second edge portion of the second surface of the substrate;
a second touch layer, having a second active touch area and a second non-active touch area, disposed on the first touch layer, and extending around a second edge of the substrate to cover a second part of the second surface of the substrate, wherein the second active touch area is disposed at the first surface of the substrate and the second non-active touch area having at least a second portion that is disposed only at the second edge portion of the second surface of the substrate and a third edge portion of the second surface of the substrate;
a reflective projection film, disposed on the second touch layer, wherein the reflective projection film is adapted to reflect an image beam from a projection device outside the touch projection screen, and the reflective projection film further extends around an edge of the substrate from the first surface of the substrate to cover a part of the second surface of the substrate; and
a circuit board, disposed on the second surface of the substrate and electrically connected with the first touch layer and the second touch layer,
wherein the first edge portion and the third edge portion are different, the first edge portion is perpendicular to the third edge portion, and the second edge portion is connected between the first edge portion and the third edge portion.

* * * * *